United States Patent
Shokrollahi et al.

(10) Patent No.: US 7,265,688 B2
(45) Date of Patent: *Sep. 4, 2007

(54) SYSTEMS AND PROCESSES FOR DECODING A CHAIN REACTION CODE THROUGH INACTIVATION

(75) Inventors: M. Amin Shokrollahi, San Jose, CA (US); Soren Lassen, San Francisco, CA (US); Richard Karp, Orinda, CA (US)

(73) Assignee: Digital Fountain, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/356,303

(22) Filed: Feb. 15, 2006

(65) Prior Publication Data

US 2006/0227022 A1    Oct. 12, 2006

Related U.S. Application Data

(63) Continuation of application No. 11/031,331, filed on Jan. 7, 2005, now Pat. No. 7,030,785, which is a continuation of application No. 10/459,370, filed on Jun. 10, 2003, now Pat. No. 6,856,263.

(60) Provisional application No. 60/388,129, filed on Jun. 11, 2002.

(51) Int. Cl.
   *H03M 7/00*    (2006.01)
(52) U.S. Cl. .......................... 341/50; 341/94
(58) Field of Classification Search .......... 341/50–107; 714/751, 786, 746, 752
   See application file for complete search history.

(56) References Cited

U.S. PATENT DOCUMENTS

| | | | |
|---|---|---|---|
| 6,073,250 A * | 6/2000 | Luby et al. ................. 714/6 |
| 6,307,487 B1 * | 10/2001 | Luby ........................... 341/50 |
| 6,320,520 B1 | 11/2001 | Luby | |
| 6,411,223 B1 | 6/2002 | Haken et al. | |
| 6,486,803 B1 | 11/2002 | Luby et al. | |
| 6,678,855 B1 | 1/2004 | Gemmell | |
| 6,748,441 B1 | 6/2004 | Gemmell | |
| 6,820,221 B2 | 11/2004 | Fleming | |
| 6,856,263 B2 | 2/2005 | Shokrollahi et al. | |
| 6,895,547 B2 | 5/2005 | Eleftheriou et al. | |
| 6,909,383 B2 * | 6/2005 | Shokrollahi et al. .......... 341/50 |
| 7,030,785 B2 * | 4/2006 | Shokrollahi et al. .......... 341/50 |
| 7,057,534 B2 * | 6/2006 | Luby ........................... 341/50 |
| 7,139,960 B2 * | 11/2006 | Shokrollahi ................. 714/752 |
| 2005/0102598 A1 * | 5/2005 | Shokrollahi ................. 714/752 |

FOREIGN PATENT DOCUMENTS

| EP | 1241795 A1 | 9/2002 |
|---|---|---|
| WO | WO96/34463 A1 | 10/1996 |
| WO | WO 03/105350 A1 | 12/2003 |

\* cited by examiner

*Primary Examiner*—Linh Nguyen (57) ABSTRACT

A method for processing a chain reaction codes includes first selecting a source symbol which is associated an output symbol of degree two or higher (i.e., an output symbol which is itself associated with two or more input symbols), and subsequently deactivating the selected source symbol in an attempt to produce an output symbol of degree one. The inactivation process can be repeated either successively until an output symbol of degree one is identified, and/or whenever the decoding process is unable to locate an output symbol of degree one.

1 Claim, 12 Drawing Sheets

Systems and Processes for Decoding
Chain Reaction Codes Through Inactivation

Systems and Processes for Decoding
Chain Reaction Codes Through Inactivation

Systems and Processes for Decoding
Chain Reaction Codes Through Inactivation

Systems and Processes for Decoding
Chain Reaction Codes Through Inactivation

Systems and Processes for Decoding
Chain Reaction Codes Through Inactivation

Fig. 8B

Systems and Processes for Decoding
Chain Reaction Codes Through Inactivation

Systems and Processes for Decoding
Chain Reaction Codes Through Inactivation

Systems and Processes for Decoding
Chain Reaction Codes Through Inactivation

Systems and Processes for Decoding
Chain Reaction Codes Through Inactivation

SYSTEMS AND PROCESSES FOR DECODING A CHAIN REACTION CODE THROUGH INACTIVATION

CROSS REFERENCE TO RELATED APPLICATION

This application is a continuation of patent application Ser. No. 11/031,331, filed Jan. 7, 2005, (now Pat. No. 7,030,785), which is continuation of application Ser. No. 10/459,370 filed Jun. 10, 2003 (now Pat. No. 6,856,263), which claims priority from and is a non-provisional patent application of provisional patent application Ser. No. 60/388,129 filed Jun. 11, 2002, the entire disclosures of these applications are incorporated herein by reference for all purposes.

BACKGROUND OF THE INVENTION

The present invention relates to systems and methods for decoding data, and more particularly, to systems and methods for decoding information additive codes and multi-stage information additive codes, herein referred to collectively as "chain reaction codes."

Chain reaction codes have been described previously in the assignee's patents, such as U.S. Pat. No. 6,307,487 entitled "Information Additive Code Generator and Decoder for Communication Systems" (hereinafter "Luby I"), and U.S. patent application Ser. No. 10/032,156, entitled "Multi-Stage Code Generator and Decoder for Communication Systems" (hereinafter "Raptor"). As described therein, chain reaction decoding is a unique form of forward error-correction that enables data reconstruction from a received data set of a given size, without regard to the particular data packets received. Communication systems employing chain reaction codes are able to communicate information much more efficiently compared to traditional FEC codes transmitted via data carousel or acknowledgement-based protocols, as described in Luby I or Raptor.

Figure 1:
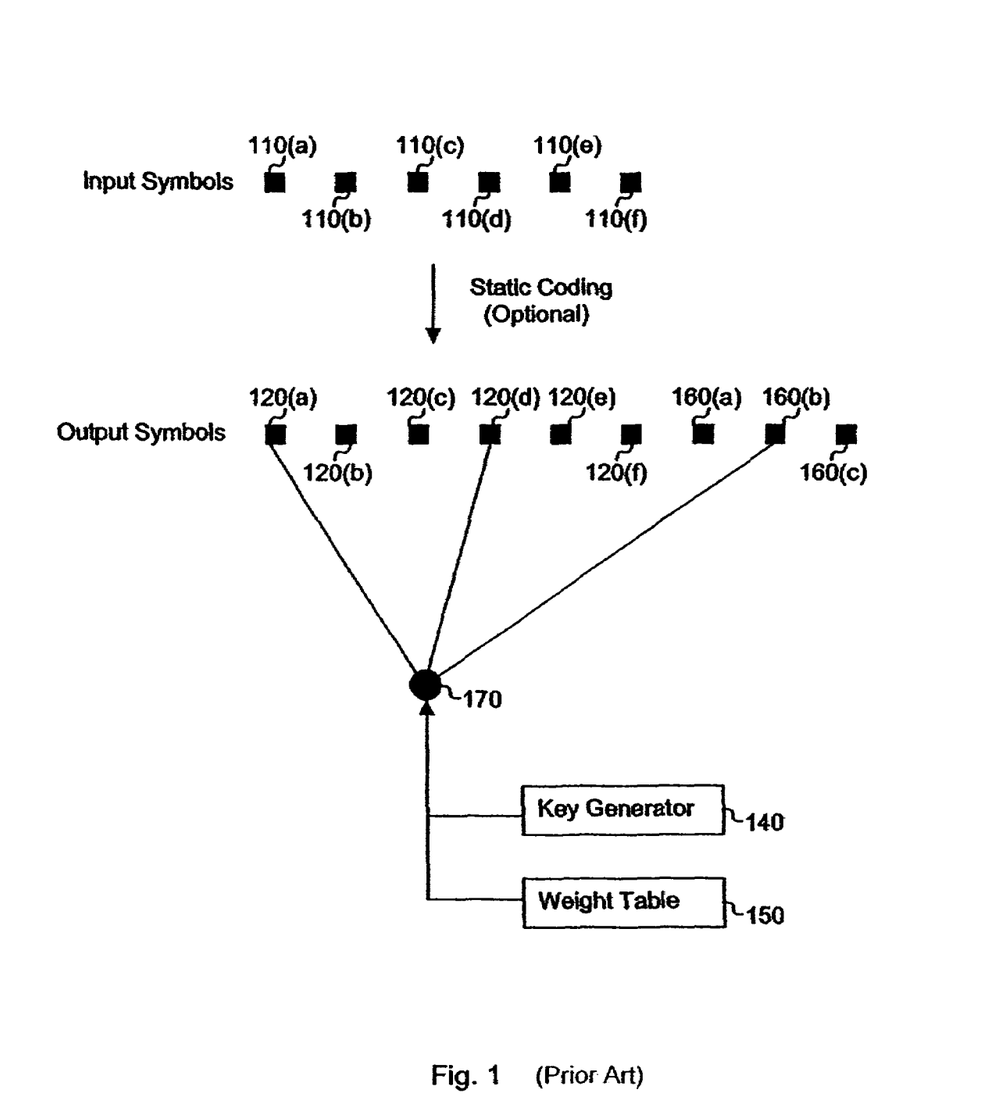
FIG. 1 illustrates an exemplary process of encoding data using chain reaction codes.

FIG. 1 illustrates an exemplary process of encoding data using chain reaction codes in which an output symbol 170 is generated from several input symbols. The input symbols are denoted 110($a$)-110($f$). In some embodiments the first step of the coding process is static encoding, as described in Raptor. This step may produce the source symbols, denoted 120($a$)-120($f$), and 160($a$)-160($c$). In some embodiments, static encoding may be systematic, so that the values of the source symbols 120($a$)-120($f$) are equal to those of 110($a$)-110($f$). In some embodiments, there may be no static encoding, in which case the input symbols coincide with the source symbols.

Once the source symbols have been created, the output symbols are generated from the source symbols. Hereinafter, an output symbol and an input symbol are described as "associated" if the value of the input symbol is used to obtain the value of the output symbol. The mathematical operation which defines this association may be any particular operation, and in one embodiment, the output symbol's value is the XOR of the values of some of the source symbols. For each output symbol, key generator 140 produces a key, from which the weight of the output symbol is determined from a weight table 150. Once the weight W is determined, W random or pseudorandom source symbols are chosen, and the value of the output symbol is computed as the XOR of the values of these source symbols. For example, in FIG. 1, the weight of the output symbol 170 is equal to 3 and its value is determined as the XOR of the source symbols 120($a$), 120($d$), and 160($b$). Correspondingly, output symbol 170 is associated to the source symbols 120($a$), 120($d$), and 160($b$). Hereinafter, the term "degree" is used synonymously with "weight."

Figure 2A:
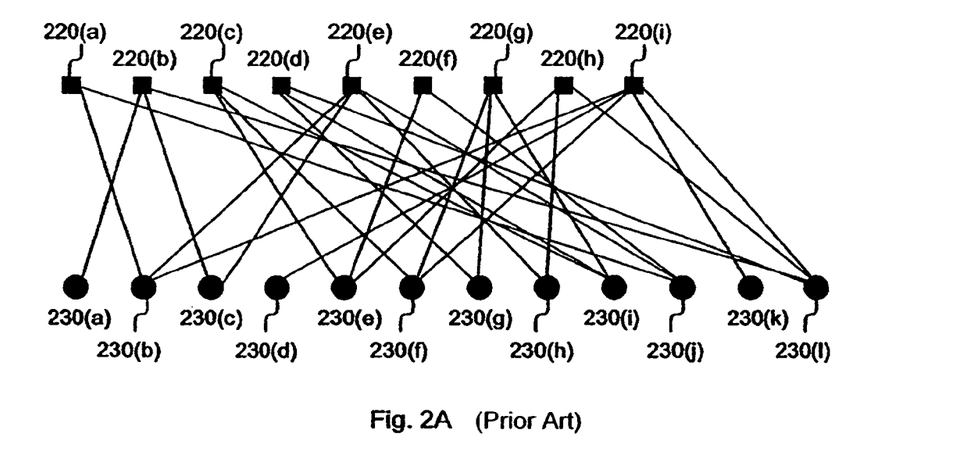
FIG. 2A illustrates an exemplary process for decoding chain reaction encoded output symbols.

FIG. 2A illustrates a decoding graph used in the decoding of a chain reaction code. This decoding graph consists of two sets of symbols, the source symbols 220($a$)-($i$), and the output symbols 230($a$)-($i$). An output symbol is connected to a source symbol if the source and output symbols are "associated," as described above FIG. 2B illustrates a decoding matrix corresponding to the decoding graph of FIG. 2A which is useful in the decoding process. The decoding matrix 200 has as many rows as there are output symbols, as many columns as there are source symbols, and is populated with entries "0" and "1". A "1" is entered at position (k,j) of the decoding matrix if the $j^{th}$ source symbol is associated with the $k^{th}$ output symbol.

In a typical chain reaction decoding process, decoding starts by identifying an output symbol $O_1$ associated with a single output symbol. The term "output symbol of degree one" refers to the aforementioned output symbol associated with only one output symbol. Similarly, an output symbol associated with two source symbols would be referred to as an output symbol of "degree two." Source symbols are referred to in a similar manner corresponding to the number of output symbols each source symbol is associated with.

Once the output symbol $O_1$ of degree one is identified, the associated source symbol of $O_1$ is recovered and is removed from the decoding graph. The process continues by identifying another output symbol $O_2$ of degree one. For example, in the situation depicted in FIG. 2, $O_1$ could be the output symbol denoted 230($a$). Once its associated source symbol 220($b$), is removed from the Decoding Graph, there are three output symbols of degree one, namely 230($c$), 230($d$), and 230($k$).

The process is continued until all the source symbols are recovered, or until there is no output symbol of degree one. For example, in the situation of FIG. 2, the following sequence of output symbols are chosen to recover the corresponding source symbols:

| Output symbol | Recovered source symbol |
| --- | --- |
| 230(a) | 220(b) |
| 230(c) | 220(e) |
| 230(h) | 220(h) |
| 230(d) | 220(i) |
| 230(i) | 220(d) |
| 230(b) | 220(a) |
| 230(j) | 220(f) |
| 230(g) | 220(g) |
| 230(e) | 220(c) |

In this case decoding is successful.

The foregoing chain reaction decoding process encounters difficulty when no output symbol of degree one is found. In some instances, the decoding process may stop prematurely and the decoder may flag an error. Alternatively, the decoder may use other more elaborate algorithms like Gaussian elimination to complete decoding, if possible. However, the running time of Gaussian elimination may be prohibitively large for applications where fast decoding is desired, especially when the number of unrecovered input symbols at the time when no more output symbols of degree one are found is large. This would lead to a decoding algorithm whose computational overhead is substantially larger than a chain reaction decoder, and may therefore be undesirable in certain applications.

For this reason, the design of chain reaction coding systems usually is done in such a way to guarantee that the decoder does not stop prematurely. This requirement may put stringent conditions on the design of the chain reaction code than may be possible using a more complex decoder. For example, it may enforce the average degree of an output symbol to be higher than otherwise, and thus may lead to a decrease in the performance of the encoder and of the decoder. More generally, this decoding procedure forces the design of the weight table to be in such a way as to guarantee the success of the abovementioned decoding algorithm with high probability, and hence may put restrictions on the set of possible weight tables.

What is therefore needed is a new decoding algorithm that offers similar computational advantages as the chain reaction decoder, and is able to continue decoding even if no output symbol of degree one is found at some stage of the decoding.

SUMMARY

The present invention provides systems and processes for decoding a chain reaction code, even when no output symbol of degree one is found in the code. This is accomplished in one embodiment by selecting a source symbol which is associated an output symbol of degree two or higher (i.e., an output symbol which is itself associated with two or more input symbols). The output symbol of degree two or higher is then deactivated in an attempt to produce an output symbol of degree one. The inactivation process can be repeated either successively until an output symbol of degree one is identified, and/or whenever the decoding process is unable to locate an output symbol of degree one. Various embodiments of the processes and systems are presented herein.

BRIEF DESCRIPTION OF THE DRAWINGS

For clarity and convenience, features and components which are identified in earlier drawings retain their reference numerals in subsequent drawings.

DETAILED DESCRIPTION OF SOME EXEMPLARY EMBODIMENTS

The following terms are used throughout the application and are intended to have the indicated meaning:

The term "active" refers to a possible state of a source symbol; The active state of a source symbol is not permanent, and the active state of a source symbol may change to either an "inactive" state, a "recoverable state", or a "recovered" state as these terms are defined below.

The terms "deactivated" or "inactive" refers to another state of a source symbol. The state of a deactivated source symbol is not necessarily permanent, and an inactive source symbol may be reactivated in processes under the present invention.

The term "recoverable" refers to yet another state of a source symbol indicating that the value of the source symbol can be recovered if the values of some other source symbols are recovered. In a particular embodiment of the invention, a source symbol may become "recoverable" through the inactivation of one or more source symbols.

The term "recovered source symbol" refers to a source symbol whose values has been determined. The value of a source symbol may be determined either directly, e.g., from the value of an output symbol to which is singly associated therewith, or indirectly, e.g., from the value of a deactivated source symbol.

Figure 3:
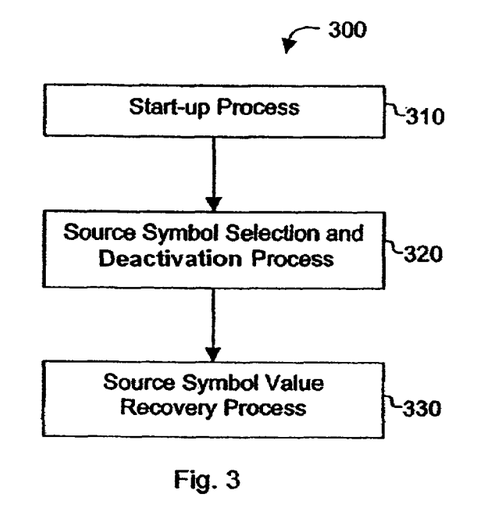
FIG. 3 illustrates an overview of the processes used to decode chain reaction codes in accordance with one embodiment of the present invention.

FIG. 3 illustrates an overview of the processes used to decode chain reaction codes in accordance with one embodiment of the present invention. The processes included in the exemplary decoding routine 300 include a start-up process 310, a source symbol selection and deactivation process 320, and a source symbol value recovery process 330.

Figure 4A:
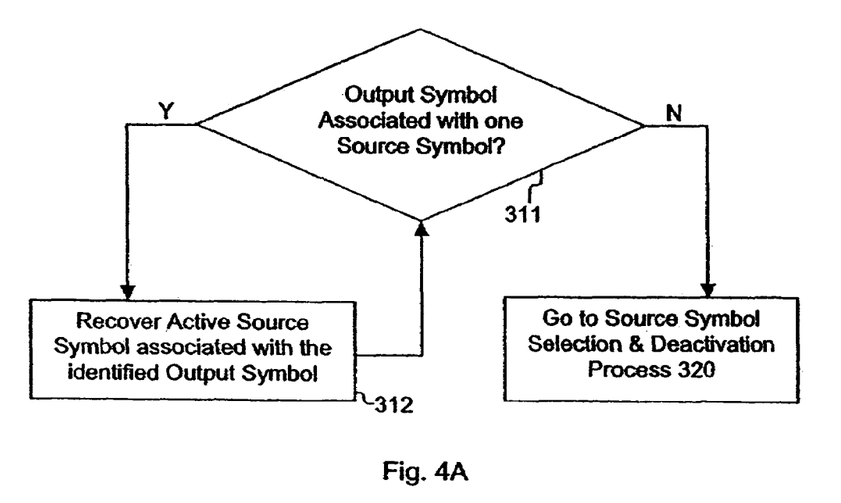
FIG. 4A illustrates a first embodiment of the start-up process shown in FIG. 3.

FIG. 4A illustrates a first embodiment of the start-up process 310 illustrated in FIG. 3. Initially at 311, a determination is made as to whether any output symbols of degree one are present. If so, the source symbol associated with that output symbol is recovered at 312. The process then returns to 311, where a subsequent determination is made as to whether any other output symbols of degree one remain in the code. If at 311 no output symbols of degree one remain, the process proceeds to the source symbol selection and deactivation process 320, further described below.

Figure 4B:
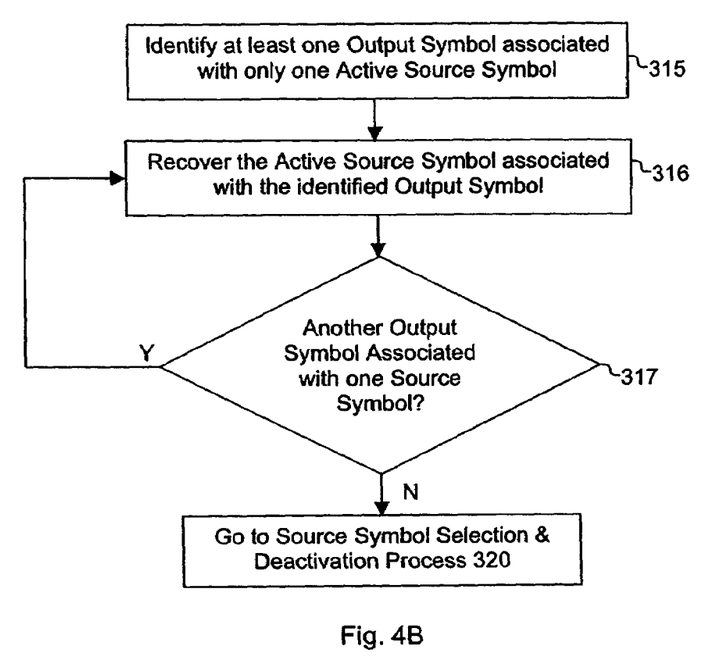
FIG. 4B illustrates a second embodiment of the start-up process 310 shown in FIG. 3.

FIG. 4B illustrates a second embodiment of the start-up process 310 illustrated in FIG. 3. In this embodiment, an output symbol of degree one is identified at 315. Subsequently at 316, the source symbol associated with the identified output symbol is recovered. Next at 317, a determination is made as to whether any other output symbol of degree one remains. If so, the process returns to 316 where the associated source symbol is recovered. If not, the process proceeds to the source symbol selection and deactivation processes described below.

In one embodiment of the invention, recovery of source symbols described in 310 occur temporally before the recovery of deactivated and recoverable source symbols referred to in 320. However, the invention is not limited thereto, and recovery of the source symbols identified in 310 may occur substantially concurrently with the recovery of the deactivated and recoverable source symbols in process 330 in alternative embodiments of the present invention.

Figure 5:
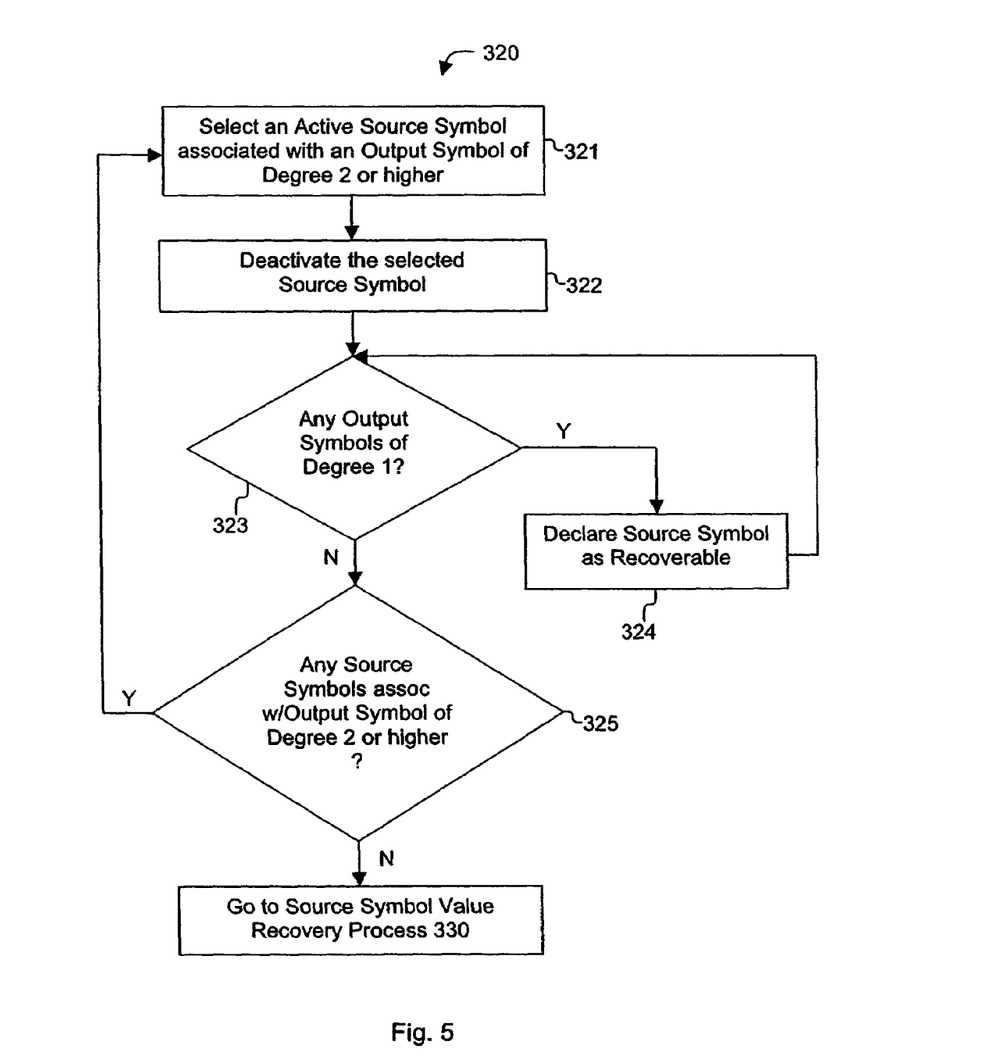
FIG. 5 illustrates a first embodiment of the source symbol selection and deactivation process shown in FIG. 3.

FIG. 5 illustrates a first embodiment of the source symbol selection and deactivation process 320 illustrated in FIG. 3. Initially at 321, an active source symbol is selected which is associated with an output symbol of degree or higher (i.e., an output symbol associated with two or more source symbols). The manner by which a particular source symbol is selected from among a number of similar source symbols is described in further detail below. Next at 322, the particular source symbol selected is deactivated. Subsequently at 323, a determination is made as to whether any output symbols of degree one exist for decoding. In some embodiments, the preceding deactivation will produce one or more output symbols of degree one. In other embodiments, the preceding deactivation will not result in an output symbol of degree one. In the later case, the process repeats the process of 321-323 as described below.

If the deactivation process of 322 does result in the production of one or more output symbols of degree one, the process continues at 324 where the source symbol associated with an output symbol of degree one is declared recoverable. The process then returns to 323 where a determination is made as to whether any additional output symbols of degree one remain. The processes of 323 and 324 are repeated until all of the output symbols of degree one produced by the preceding deactivation process are declared recoverable.

If the deactivation of the selected source symbol at 322 does not result in an output symbol of degree one, or once all of the source symbols associated with an output symbol of degree one are declared recoverable at 324, the-process continues from 323 to 325, where a determination is made as to whether any source symbols associated with output symbols of degree two or higher remain. If so, the process returns to 321 where another active source symbol associated with an output symbol of degree two or higher is selected, deactivated, and the presence of output symbols of degree one is checked. One or more iterations of the processes may occur, for instance, where the deactivation of a first source symbol associated with an output symbol of degree two or higher does not result in an output symbol of degree one, but additional source symbols associated with an output symbol of degree two (or higher) remain. In this case, the subsequent deactivation of another source symbol associated with an output symbol of degree two (or higher) may produce one or more output symbols of degree one. The process repeats until all source symbols have been either been recovered (via the start-up process 310), deactivated (via 322), or declared recoverable (via 325), at which point the process proceeds to the source symbol value recovery process 330.

Figure 6:
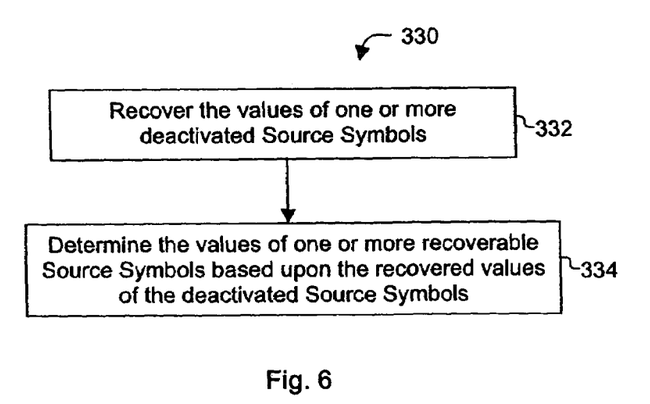
FIG. 6 illustrates one embodiment of the source symbol recovery process shown in FIG. 3.

FIG. 6 illustrates one embodiment of the source symbol recovery process 330 illustrated in FIG. 3. Initially at 332, the values of one or more source symbols deactivated in 322 are recovered. In a specific embodiment, for instance in which Gaussian elimination is used in the decoding process, all values of deactivated source symbols are recovered in this process. Subsequently at 334, the values of one or more source symbols declared recoverable in process 325 are determined using the recovered values of the deactivated source symbols. In one implementation, such as the aforementioned in which Gaussian elimination is used, the values of all recoverable source symbols are determined in this process. In alternative embodiments of 332 and 334, the values of one or more, but fewer than all of the recoverable source symbols are determined. This may be advantageous when, for reasons of necessity, expediency, cost, etc., a complete decoding of the chain reaction code is not required or possible. The processes of 332 and 336 are further illustrated in a specific embodiment below.

Figure 7A:
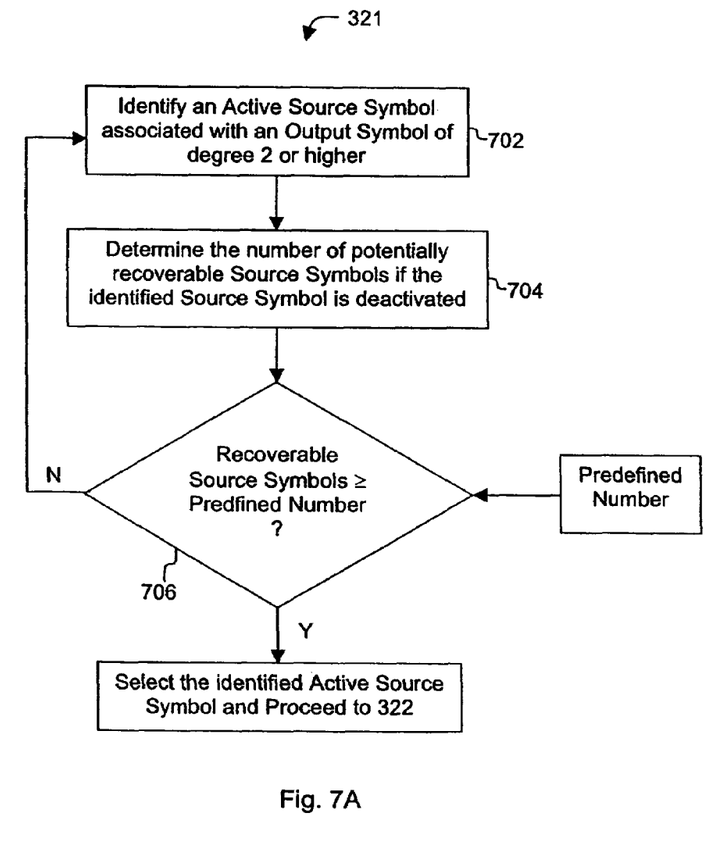
FIG. 7A illustrates a second embodiment of the source symbol selection process shown in FIG. 3

FIG. 7A illustrates a second embodiment of the source symbol selection process 321, whereby an active source symbol associated with an output symbol of degree at least is selected for deactivation. Initially at 702, an active source symbol associated with an output symbol of degree two or higher is identified. Next at 704, a determination is made as to the number of source symbols that are potentially recoverable (i.e., source symbols which may become recoverable without further source symbol inactivation) if the identified source symbol were deactivated. Next at 706, a comparison is made between the number of potentially recoverable source symbols, and a predefined number, whereby if the number of potentially recoverable source symbols exceeds the predefined number, the identified source symbol is selected for deactivation in 322. If the number of potentially recoverable source symbols does not meet or exceed the predefined number, then the process returns to 702 where another source symbol associated with an output symbol of degree of two or higher is identified.

Those of skill in the art will appreciate that other selection criteria may be used to select source symbols in order to obtain the largest number of output symbols of degree one. For example in one process, the source symbol associated with the largest number of output symbols is selected for deactivation. In another embodiment, a source symbol is randomly selected from a group of those source symbols associated with two or more output symbols. In still a further embodiment, an output symbol is identified which is associated with a predetermined number of source symbols, e.g., the fewest. Subsequently, all but one of the source symbols is selected for deactivation.

In another embodiment of the source symbol selection process, a string of source symbols may be recovered. In this process, an output symbol of degree two is to be identified such that one of its associated source symbols is itself associated with a second output symbol of degree two, and such that one of its associated source symbols is itself associated with a third output symbol of degree two, and so on. Such a chain of output symbols will be called a degree-two-chain hereinafter.

Figure 7B:
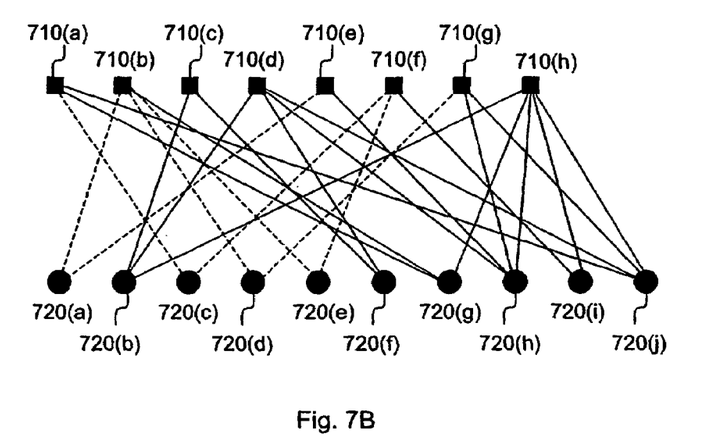
FIG. 7B illustrates a decoding graph for a degree-2 chain in accordance with one embodiment of the present invention.

FIG. 7B illustrates a decoding graph of a degree-two chain in accordance with one embodiment of the present invention. The output symbols that participate in one possible degree-2-chain are 720(a), 720(c), 720(d), 720(e), and 720(h). Deactivating, for example, source symbol 710(a)

reduces the degree of output symbol 720(*c*) to one, which makes source symbol 710(*f*) recoverable, which in turn reduces the degree of output symbol 720(*e*) to one. This makes source symbol 710(*b*) recoverable, which reduces the degrees of 720(*a*) and 720(*d*) to one, and these make 710(*g*) and 710(*e*) recoverable. As can be seen, if the number of output symbols in such a chain is k, and if any of the associated source symbols of any of the output symbols in such a chain is deactivated, then the existence of an output symbol of degree one is guaranteed for k consecutive steps of inactivation decoding. This process may further include identifying an output symbol of degree two which leads to a degree-2-chain of maximal length, and deactivating a source symbol associated with the identified output symbol.

Any of the source symbol selection processes may further include a "back-tracking process" by which the deactivated source symbol is reactivated, and another source symbol is selected for deactivation in accordance with the methods presented herein. The invention is not limited to the exemplary processes by which a source symbol is selected for deactivation, and any method in which a source symbol associated with two or more output symbols is selected can be used in the present invention.

Figure 2B:
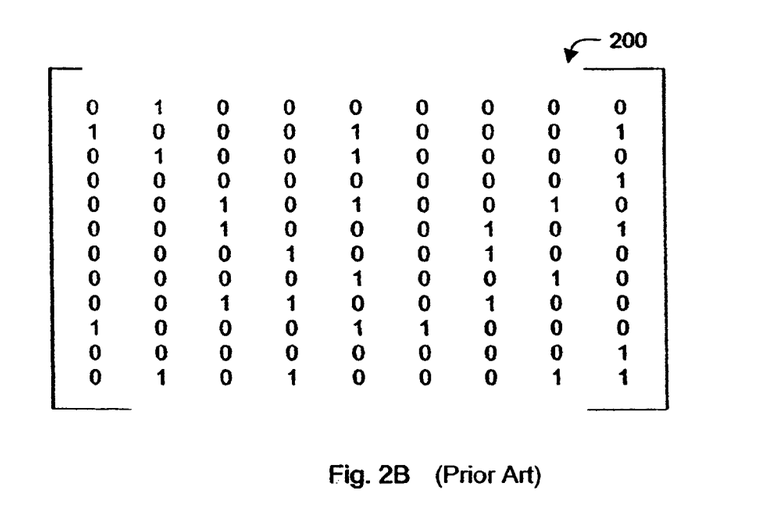
FIG. 2B illustrates a decoding matrix corresponding to the decoding graph of FIG. 2A.
Figure 8A:
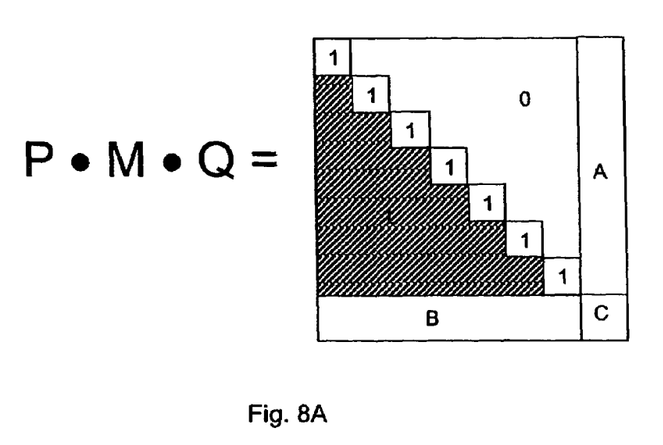
FIG. 8A illustrates a modified decoding matrix in accordance with the present invention.
Figure 8B:
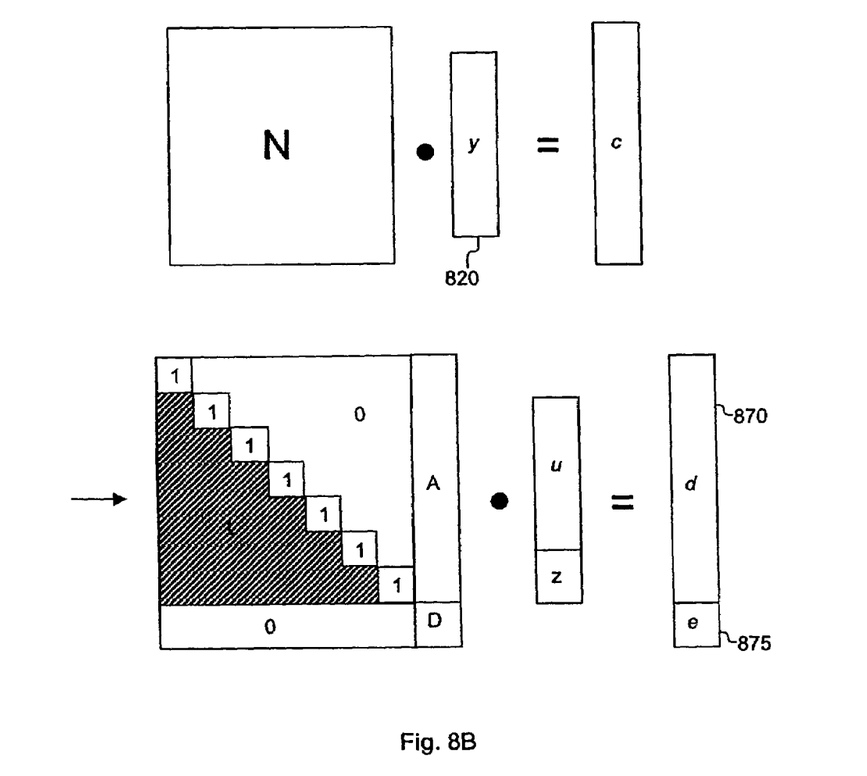
FIG. 8B illustrates the process of applying Gaussian elimination to the decoding matrix in accordance with one embodiment of the present invention.

As explained above with reference to FIG. 2B, a decoding matrix is useful in the decoding of chain reaction codes. With particular regard to the decoding process using inactivation, the decoding matrix 200 of FIG. 2B can be modified to accommodate the inclusion of inactive source symbols. Specifically, where the sequence of indices of inactive source symbols during the decoding process is the sequence $i_1, i_2, \ldots, i_n$, and the number of source symbols is K, then inactivation decoding produces permutation matrices P and Q, where Q interchanges columns $i_1$ and K−n+1, $i_2$ and K−n+2, ... and $i_n$ and K, and such that P·M·Q has the shape given in FIG. 8B. The modified decoding matrix shown in FIG. 8A consists of a lower triangular matrix L, and submatrices A, B, and C. The columns of the submatrix A correspond to the inactive source symbols. The task of the decoder is to solve the system of K' linear equations in K unknowns $x_1, \ldots, x_K$ given by $$P \cdot M \cdot Q \cdot (Q^{-1} x) = P \cdot b,$$

where x is the column vector $(x_1, \ldots, x_K)$, and b is the vector consisting of the values of the K' received output symbols. In practice, the matrices P and Q may not be stored as full matrices, but as permutations computed by tracking the process of the Inactivation Decoding This form usually requires much less memory than the storage of a complete matrix. As can be appreciated by those skilled in the art, the recovery process does not depend on the specific permutation of the columns of the illustrated decoding matrix, and other column permutations may be used in alternative embodiments under the present invention.

Of the many ways possible for computing the solution x of the system of equations given above, we will illustrate in the following one possibility. This is served for descriptive purposes only and is not intended to limit the scope of this invention For the description of the core of the algorithm, it is advantageous to denote the vector $Q^{-1} \cdot x$ by y, and redefine the task of decoding as the task of computing the vector y. Once y is computed, x may be efficiently computed as the permutation of y described by Q. Further, the matrix P·M·Q is denoted by N; the vector P·b is denoted by c, that is, c is the permutation of b described by P, which is again efficient to compute. The task is then to calculate the vector y satisfying N·y=c, where N has the shape given in FIG. 8A.

To solve this system, Gaussian elimination may be applied to matrix N. The rows of the submatrix B are eliminated by the rows of the lower triangular matrix L. The same transformation is applied to the vector c. This action transforms the matrix B into the matrix consisting of zeros, and the matrix C is transformed into a different matrix D, obtained by applying the same elimination steps to the matrices A and C. This transformation is shown in FIG. 8B. Assuming that n source symbols have been deactivated, and that there are K source and K' output symbols, the submatrix L has (K−n) rows and (K−n) columns, the matrix A has (K−n) rows and n columns, and the matrix D has (K'−K+n) rows and n columns. The submatrices L and A in the transformed matrix are the same as the corresponding submatrices in the matrix N. The vector b is also transformed into another vector f having two components: the vector d given in 870 which consists of the first K−n components of f, and the vector e in 875 consisting of the remaining components of f. Correspondingly, the unknown vector y in 820 is subdivided into two subvectors. The vector u consisting of the first K−n entries of y, and the vector z consisting of the remaining n entries.

This elimination transforms the original system of equations into two separate systems: the system given by D·z=e, and the system L·u+A·z=d. The values of the unknown vector z correspond to the values of the source symbols corresponding to the inactivated source symbols. Once these values are found from the set of equations D·z=e, the remaining values given by u can be found in a variety of ways. In some embodiments of the present invention, these values can be found by multiplying the matrix A with z, XOR'ing the resulting vector with d to obtain a vector g, and solving the system of equations L·u=g. In some embodiments, the latter system may be solved using a chain reaction decoder. In yet other embodiments, the value of each source symbol corresponding to an inactive source symbol is XOR'd with the values of the output symbols corresponding to the neighboring output symbols associated to said source symbol, and the inactive source symbol is removed from the corresponding decoding graph (not shown). This produces a new restricted decoding graph with all the inactive source symbols removed. Then a normal chain reaction decoding may be applied to the restricted Decoding Graph to recover the other source symbols.

The system of equations D·z=e can be solved in a variety of ways. In some embodiments, this system may be solved using the Gaussian elimination algorithm. In other embodiments, the inactivation decoding may be applied recursively to obtain the unknown values of the inactive source symbols. Other methods for solving systems of linear equations may also be applied.

In some embodiments of the inactivation decoder, the decoding process may begin before all the output symbols have been entered into the decoding graph. In these embodiments, whenever the decoding graph has no more output symbols of degree one and has at least one active source symbol, the above-described strategies may be employed to determine whether to inactivate a source symbol or whether to enter another output symbol into the Decoding Graph if such an output symbol exists. In cases where the decoding process begins before all the output symbols have been collected, the creation of the decoding matrix, and the elimination process for the decoding matrix may happen substantially concurrently with the reception process, with one or more steps of the elimination process being done with the reception of every new output symbol. Alternatively, more than one output symbol could be collected at a time, and decoding could proceed until all the said output symbols are processed; if not all source symbols are recovered at this point, another set of output symbols could be requested and processed, until all the source symbols have been recovered.

Figure 9A:
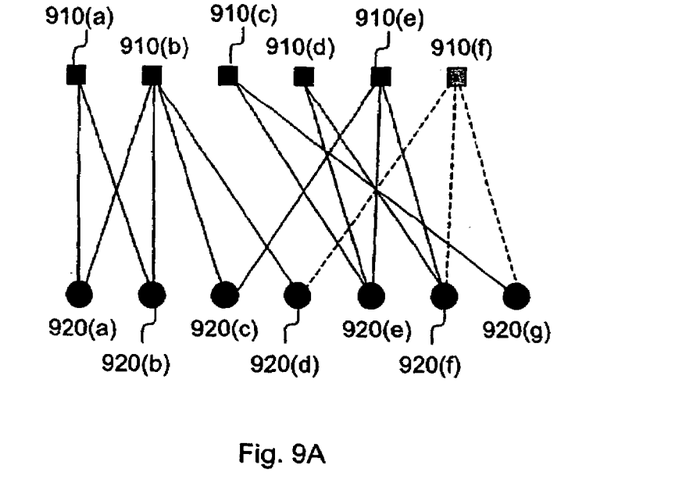
FIGS. 9A and 9B illustrate an example of inactivation decoding using decoding graphs and matrices in accordance with one embodiment of the present invention.
Figure 9B:
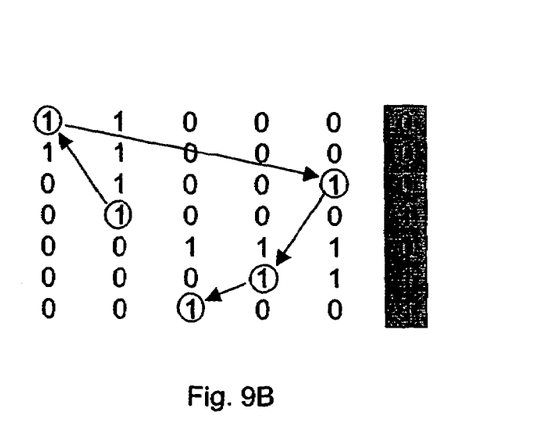

FIGS. 9A and 9B illustrate an example of inactivation decoding using the aforementioned decoding graphs and matrices in accordance with one embodiment of the present invention. The original decoding graph of FIG. 9A contains six source symbols denoted 910(*a*)-910(*f*), and seven output symbols denoted 920(*a*)-920(*g*). As can be seen, conventional chain reaction decoding cannot even begin on this graph, since there are no output symbols of degree one. By deactivating source symbol 910(*f*), chain reaction decoding can begin, and at each stage an output symbol of degree one is found.

FIG. 9B illustrates the permutation occurring within the decoding matrix as a result of the inactivation process. Deactivating symbol 910(*f*) results in deactivating the last column of the matrix. The remaining columns can then be transformed into a lower triangular form. The sequence of circles and arrows indicate the order in which the rows and columns have to be permuted, by noting that a position that the k-th arrow points to needs to be permuted with position (k,k) of the new lower triangular matrix. For example, the permutations have to be done in the order so that position (2,4) becomes position (1,1), position (1,1) becomes position (2,2), position (3,5) becomes position (3,3), etc.

Figure 10A:
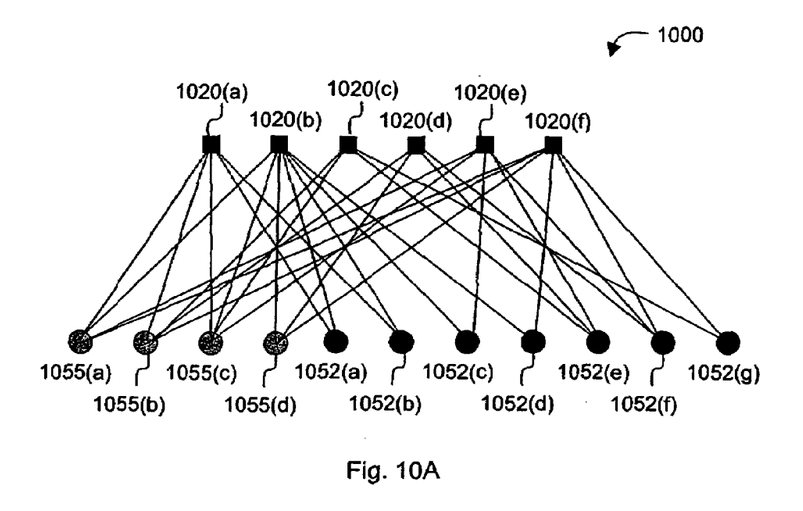
FIG. 10A illustrates a modified decoding graph-useful in decoding a multi-stage chain reaction code in accordance with one embodiment of the present invention.

FIG. 10A illustrates a modified decoding graph 1000 useful in decoding a multi-stage chain reaction code, such as that described in Raptor. The graph 1000 includes a plurality of source symbols 1020(*a*)-(*f*) and multi-stage output symbols 1050, which collectively include previously described output symbols 1052(*a*)-(*g*), and check symbols 1055(*a*)-(*d*). The output symbols 1052 are as previously described, each being associated with one or more source symbols. Each of the check symbols 1055 is also associated with one or more source symbols and describes the mathematical relationship between two or more source symbols. For example, symbol 830(*a*) means that the XOR of the values of the source symbols corresponding to source symbols 810(*a*), 810(*b*), 810(*e*), and 810(*f*) is zero. The interrelationship between source symbols may be imparted by a static encoding process such as low-density parity-check code and the like.

As a particular example, where a low-density parity-check code is used for the static encoding process, then a number of multi-stage output symbols equal to the number of check symbols in this code may be added to the decoding graph, their value set to 0, and the decoding graph may be augmented by the graph of the low-density parity-check code between the source symbols and the check symbols, and the decoding graph may be replaced by the new graph. The choice of low-density parity-check codes is not essential to this application. In general, for any type of static encoding, the corresponding parity-check matrix defines a bipartite graph by which the decoding graph may be augmented.

Figure 10B:
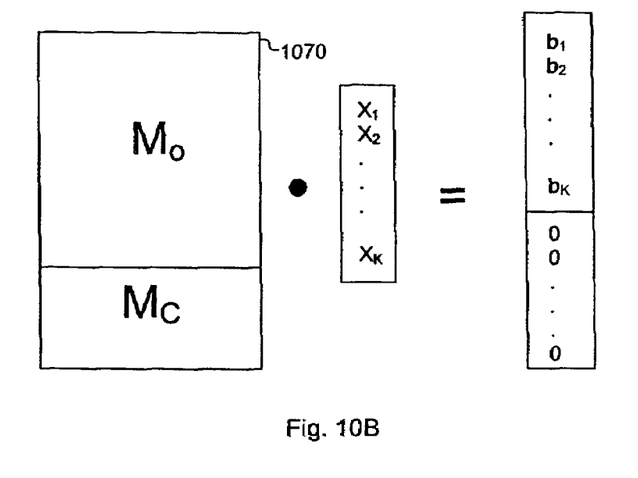
FIG. 10B illustrates a modified decoding matrix corresponding to the modified decoding graph 10A.

FIG. 10B illustrates a modified decoding matrix 1070 which corresponds to the modified decoding graph 10A. The modified decoding matrix 1070 is populated with zeros and ones, and has as many columns as there are source symbols, and as many rows as the aggregate number of output symbols and check symbols. Correspondingly, the modified decoding matrix 1070 consists of two sets of rows, one corresponding to the output symbols, and one corresponding to the check symbols. Where there are K' output symbols, C check symbols, and K source symbols, the modified decoding matrix may be decomposed into a submatrix $M_o$ consisting of K' rows and K columns, and a matrix $M_c$ consisting of C rows and K columns. If $x_1, \ldots, x_K$ denote the unknown values of the source symbols, and $b_1, \ldots, b_{K'}$ denote the known values of the received output symbols, the task of the decoder may be to solve the system of equations given by $M_o \cdot x = b$, and $M_c \cdot x = 0$. The combined system of equations would be as given in FIG. 10B.

In some embodiments of this invention, inactivation decoding may proceed in the same manner as described above, with the decoding graph of FIG. 9A being replaced by the modified decoding graph of FIG. 10A, and the decoding matrix of 8B replaced by the modified decoding matrix of FIG. 10B. In other embodiments, the different symbols of the modified decoding graph 1000 may be given different priorities during the different phases of the decoding. For example, the decoding may start by processing output symbols only, and resorting to check symbols of degree one only if there are no output symbols of degree one left. In some applications, this may lead to lower memory and computational resources, as check symbols are injected into the modified decoding graph on an as-needed basis.

Each of the methods described herein may be practiced in a multitude of different ways (i.e., software, hardware, or a combination of both) and in a variety of systems. In one embodiment, the described methods can be implemented as instruction codes stored either on a computer readable disk, in memory (volatile or non-volatile), or reside within a processor (computer, embedded processor, and the like). In addition, a system for decoding a chain reaction code using the inactivation techniques described herein may comprise a computer or other such programmable machine having a memory operable to store and/or execute instruction codes corresponding to the processes described herein.

Figure 11A:
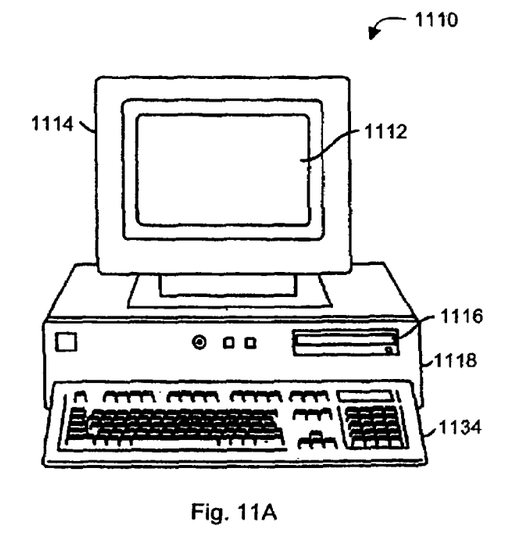
FIG. 11A illustrates an exemplary computer system operable to execute instruction codes corresponding to processes of the described methods in accordance with the present invention.

FIG. 11A illustrates an exemplary computer system operable to execute instruction codes corresponding to processes of the described methods. Computer system 1110 includes a monitor 1114, screen 1112, cabinet 1118, and keyboard 1134. A mouse (not shown), light pen, or other I/O interfaces, such as virtual reality interfaces may also be included for providing I/O commands. Cabinet 1118 houses a drive 1116 for removable media such as CD or DVD, and a hard drive (not shown). The computer system 1110 may include drives and/or drive interfaces which operable to record onto or read from data, instruction code, and other information needed to execute the methods of the present invention. Cabinet 718 also houses familiar computer components (not shown) such as a processor, memory, and the like.

Figure 11B:
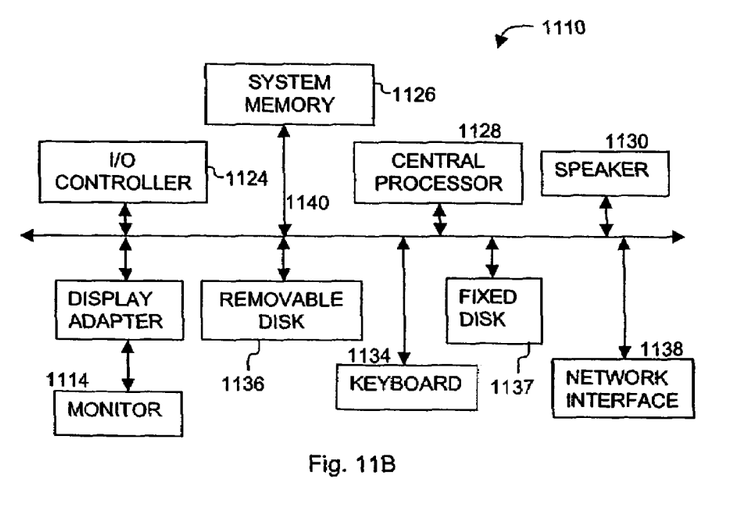
FIG. 11B illustrates a simplified system block diagram of the exemplary computer system used to execute instruction codes corresponding to the described methods in accordance with the present invention.

FIG. 11B illustrates a simplified system block diagram of the exemplary computer system 1110 used to execute instruction codes corresponding to the described methods. As shown in FIG. 11A, computer system 1110 includes monitor 1114 which optionally is interactive with the I/O controller 1124. Computer system 1110 further includes subsystems such as system memory 1126, central processor 1128, speaker 1130, removable disk 1136, keyboard 1134, fixed disk 1137, and network interface 1138. Other computer systems suitable for use with the described methods may include additional or fewer subsystems. For example, another computer system could include an additional processor. Arrows such as 1140 represent the system bus architecture of computer system 1110. However, these arrows 1140 are illustrative of any interconnection scheme serving to link the subsystems. For example, a local bus could be utilized to connect the central processor 1128 to the system memory 1126. Computer system 1110 shown in FIG.

11B is but an example of a computer system suitable for use with the present invention. Other configurations of subsystems suitable for use with the present invention will be readily apparent to one of ordinary skill in the art Accordingly, in some embodiments of the present invention the inactivation decoding mechanism is used to reduce the reception overhead of chain reaction coding when the entire original content needs to be reconstructed.

In other embodiments of the present invention, the inactivation decoder is used to reduce the average degree of an output symbol, and hence decrease the computational resources used for creating output symbols.

Another property of a chain reaction coding system using an inactivation decoder is that a weight table can be designed in which none of the output symbols may be of degree one. This means that none of the output symbols of such a coding system contains the value of an input symbol. In some embodiments, this property can be used to reduce the average degree of the output symbols, thereby decreasing the computational load on the encoder. Moreover, in some applications, this property may be used to give the transmission a light level of security against unauthorized access to the original data.

INACTIVATION DECODING EXAMPLE

An embodiment of a chain reaction coding system as disclosed in Raptor is described by the number of data symbols, denoted N, a static encoding which generates R static encoding symbols, and a dynamic encoder described by a weight table. In some embodiments a reception overhead. may also be specified that gives good probabilistic guarantees of the success of the decoder. In other embodiments, output symbols may be collected until complete decoding is possible, and there is no need for specifying a reception overhead.

The following table describes various parameters for an exemplary inactivation decoder, with the first column giving the range for the value N, the second giving information on the generation of static encoding symbols, the third giving the weight table for the generation of dynamic encoding symbols, and finally the fourth giving the number of static encoding symbols computed:

| N range | Weight table | | Static | Overhead |
|---|---|---|---|---|
| 1-200 | 9 | 1 | S0 | 5% + 130 |
| 200-970 | 9 | 1 | S1 | 5% + 130 |
| 970-1250 | 9 | 1 | S1 | 5% + 140 |
| 1250-1320 | 9 | 1 | S1 | 5% + 130 |
| 1320-2100 | 3 | 0.5 | S1 | 5% + 110 |
|  | 5 | 0.5 |  |  |
| 2100-2500 | 1 | 2/3 | S1 | 5% + 100 |
|  | 9 | 1/3 |  |  |
| 2500-4100 | 1 | 2/3 | S1 | 5% + 100 |
|  | 8 | 1/3 |  |  |

-continued

| N range | Weight table | | Static | Overhead |
|---|---|---|---|---|
| 4100-5000 | 1 | 2/3 | S1 | 5% + 100 |
|  | 7 | 1/3 |  |  |
| 5000-8100 | 1 | 2/3 | S2 | 5% + 100 |
|  | 7 | 1/3 |  |  |
| 8100-16500 | 1 | 2/3 | S2 | 5% + 100 |
|  | 6 | 1/3 |  |  |
| 16500-65536 | 1 | 2/3 | S2 | 5% + 100 |
|  | 5 | 1/3 |  |  |
| >65536 | 1 | 2/3 | S2 | 5% + 100 |
|  | 4 | 1/3 |  |  |

For example, the ninth row in the table means that if N is between 5000-8100, then the number R of static encoding symbols is the smallest integer greater than or equal to 005*N+100. In all the cases, the first stage of the static encoder may use first a Hamming code to encode the original symbols, as described in Raptor. The second stage may use a low-density parity-check code. In the example given by the ninth row, the parity-check matrix of this code consists of two submatrices. The first has $\lfloor 2*R/3 \rfloor$ rows and N+R columns, where $\lfloor a \rfloor$ denotes the largest integer smaller than or equal to a. The second submatrix has $R-\lfloor 2*R/3 \rfloor$ rows and N+R columns. Each of these submatrices is picked randomly subject to the condition that in the first matrix each column has exactly 1 nonzero entry, and in the second matrix each column has exactly 7 nonzero entries.

The weight tables corresponding to S0, S1, and S2 are given by:

| Weight table for S0 | |
|---|---|
| Weight | Probability |
| 7 | 1 |

| Weight table for S1 | |
|---|---|
| Weight | Probability |
| 1 | 0.0221538 |
| 2 | 0.492912 |
| 3 | 0.166059 |
| 4 | 0.0768401 |
| 5 | 0.0803003 |
| 8 | 0.0636444 |
| 9 | 0.0353027 |
| 19 | 0.0439408 |
| 20 | 0.0188495 |

Weight table for S2

| Weight | Probability |
|---|---|
| 1 | 0.008199 |
| 2 | 0.507871 |
| 3 | 0.171036 |
| 4 | 0.074750 |
| 5 | 0.084950 |
| 8 | 0.057682 |
| 9 | 0.038307 |
| 19 | 0.057200 |

The average weights of S1 and S2 are 4.254 and 4.154, respectively.

If the reception overhead is fixed at 5% or 50, whichever is larger, then it can be mathematically proven that the probability of failure of the inactivation decoding is less than $10^{-13}$. The concrete example given here is only for illustrative purposes. Variations of the actual numbers lead to designs which are within the scope of this invention.

Figure 12A:
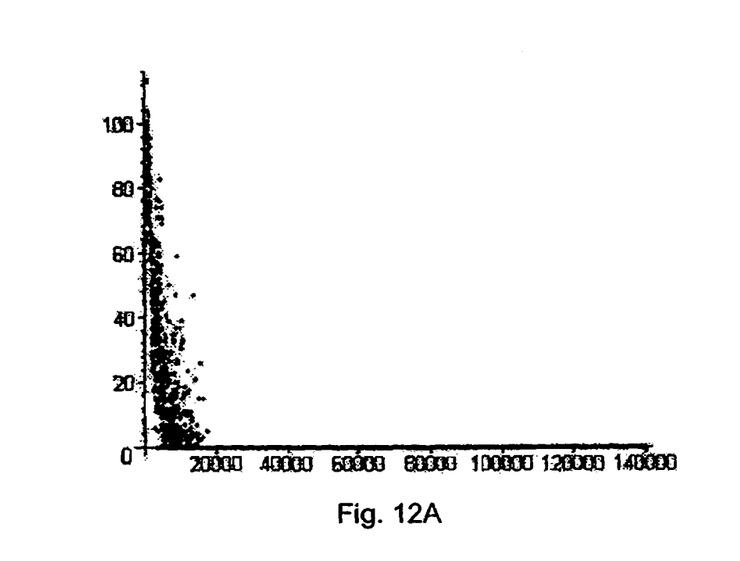
FIGS. 12A-12B show plots describing several thousand computer simulations of the inactivation decoder for various values of the number of input symbols N.
Figure 12B:
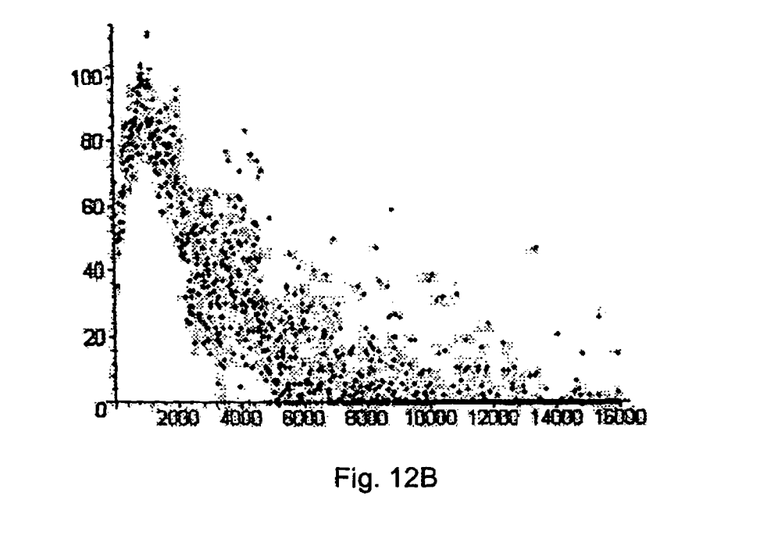

FIGS. 12A-12B show plots describing several thousand computer simulations of the inactivation decoder for various values of the number of input symbols N. The horizontal axis denotes N, and the vertical axis denotes the number of inactive source symbols in the Modified Decoding Graph. Each point represents one round of simulation. FIG. 10(a) shows the range of N between 1 and 140,000. FIG. 10(b) is the magnification of FIG. 10(a) for the range of N between 1 and 16,000.

As can be seen, in some of the runs the number of inactive source symbols is zero, meaning that the normal chain reaction decoder would have completed the decoding. However, where N is between 1 and 10,000, in the majority of the cases the number of inactive source symbols larger than one. In these cases the normal chain reaction decoder would have failed. The number of inactivated source symbols is very often zero of the number N of source symbols is larger than 20,000. In these cases, the decoder is particularly fast, while giving exceptionally good probabilistic guarantees on successful decoding.

The foregoing description has been presented for purposes of illustration and description. It is not intended to be exhaustive or to limit the invention to the precise form disclosed, and obviously many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

References Incorporated Herein

The following references are herein incorporated by reference in their entirety for all purposes:

U.S. Pat. No. 6,307,487 entitled: "Information Additive Code Generator and Decoder for Communication Systems"

U.S. patent application Ser. No. 10/032,156 entitled: "Multi-Stage Code Generator and Decoder for Communication Systems"

What is claimed is:

1. A method of decoding encoded source symbols using chain reaction code, the method comprising:
   receiving a plurality of active source symbols;
   selecting one of the active source symbols that is associated with an output symbol of degree two or higher;
   deactivating the selected source symbol that is associated with the output symbol of degree two or higher; and
   if the deactivation of the selected source symbol results in at least one output symbol of degree one, declaring the selected source symbol associated with the at least one output symbol of degree one as recoverable.

* * * * *